(12) United States Patent
Iino

(10) Patent No.: US 6,171,392 B1
(45) Date of Patent: Jan. 9, 2001

(54) METHOD FOR PRODUCING SILICON SINGLE CRYSTAL

(75) Inventor: Eiichi Iino, Gunma-ken (JP)

(73) Assignee: Shin-Etsu Handotai Co., Ltd., Tokyo (JP)

(*) Notice: Under 35 U.S.C. 154(b), the term of this patent shall be extended for 0 days.

(21) Appl. No.: 09/282,346

(22) Filed: Mar. 31, 1999

(30) Foreign Application Priority Data

Apr. 7, 1998 (JP) .................................................. 10-111412

(51) Int. Cl.[7] .................................................. C30B 15/20
(52) U.S. Cl. .................................. 117/20; 117/13; 438/471
(58) Field of Search .......................... 117/13, 20; 438/471

(56) References Cited

U.S. PATENT DOCUMENTS

| 4,545,849 | 10/1985 | d'Aragona | 117/20 |
| 5,178,720 | * 1/1993 | Frederick | 117/30 |
| 5,359,959 | * 11/1994 | Fusegawa et al. | 117/13 |
| 5,478,408 | * 12/1995 | Mitani et al. | 448/33.3 |
| 5,628,823 | 5/1997 | Chandrasekhar et al. | 117/15 |
| 5,940,722 | * 8/1999 | Tamura | 438/471 |

FOREIGN PATENT DOCUMENTS

| 0461769A1 | 12/1991 | (EP) . | |
| 5-139880 | 6/1993 | (JP) | C30B/15/36 |
| 09255485 | 9/1997 | (JP) | C30B/15/36 |

OTHER PUBLICATIONS

Mikkelsen, et al, Direct Comparison of FTIR and SIMS Calibrations for (0) in Silicon, Mater. Res. Soc., USA, 1986, XP-002111511.

European Search Report dated Aug. 19, 1999 for application No. 99302365.4–2104.

Sumino, et al., "The Origin of the Difference in the Mechanical Strengths of Czochralski–Grown Silicon and Float–Zone–Growth Silicon," *Japanese Journal of Applied Physics*. vol. 19, No. 1, Jan., 1980 pp. L49–52.

* cited by examiner

*Primary Examiner*—Felisa Garrett
(74) *Attorney, Agent, or Firm*—Hogan & Hartson, LLP

(57) ABSTRACT

A method for producing a silicon single crystal by a Czochralski method comprises bringing a seed crystal into contact with a melt, performing a necking operation, and growing a single crystal ingot, wherein concentration of interstitial oxygen incorporated during the necking operation is 1 ppma (JEIDA) or more. The rate of success in making dislocation-free crystals is improved in a seeding method in which a necking operation is performed.

16 Claims, 1 Drawing Sheet

(a) (b) (c)

METHOD FOR PRODUCING SILICON SINGLE CRYSTAL

BACKGROUND OF THE INVENTION

1. Field of the Invention

The present invention relates to a method for producing a silicon single crystal by Czochralski method (CZ method) comprising using a silicon seed crystal, performing a necking operation, and growing a silicon single crystal ingot.

2. Description of the Related Art

In a conventional method of manufacturing a silicon single crystal according to CZ method, a seed crystal which is a silicon single crystal is brought into contact with silicon melt and is then slowly pulled while being rotated to grow a silicon single crystal ingot. In the method, in order to eliminate dislocation caused by propagation of slip dislocation generated in the seed crystal in high density due to thermal shock, a tapered necking part and a neck portion having a smaller diameter as approximately 3 mm is formed after the silicon seed crystal is brought into contact with a silicon melt, namely so called necking operation is performed. Subsequently, the diameter of the crystal is increased to be a predetermined value, and then a dislocation-free silicon single crystal can be pulled. The above-mentioned necking operation is well known as Dash Necking method, which is a common method for pulling a silicon single crystal ingot according to CZ method.

The seed crystal conventionally used is in a cylindrical shape having a diameter of approximately 8 to 20 mm or a prismatic shape having a side length of approximately 8 to 20 mm, wherein a cut-away portion or notch is formed thereon for attachment to a seed crystal holder, and a shape of a lower end thereof to be brought into contact with a silicon melt first is flat. To pull a heavy single crystal ingot safely, thickness of the seed crystal cannot be smaller than the above value in light of strength of the material.

In the seed crystal having such a shape, slip dislocation generates in high density, since a heat capacity of the lower end which is brought into contact with a silicon melt is large, a temperature difference generates rapidly in the crystal as soon as the seed crystal is brought into contact with the silicon melt, resulting in generation of dislocation in high density. Accordingly, the above-mentioned necking operation is necessary to eliminate dislocation in the single crystal.

However, in the above mentioned method, a minimum diameter of the neck portion has to be decreased to approximately 3 to 5 mm in order to eliminate the dislocation, even when the necking condition is chosen appropriately. Such a small diameter is insufficient in strength to support a single crystal ingot such as manufactured in recent years, which has been getting heavier with increase of a diameter thereof. This may lead to a serious accident such that the fine neck portion is broken while the single crystal ingot is pulled, and the single crystal ingot falls.

To solve the above-mentioned problems, the applicant proposed inventions as disclosed in Japanese Patent Application Laid-open (kokai) No. 5-139880 and No. 9-255485 (Japanese Patent Application No. 8-87187). In these inventions, a seed crystal having a wedge or hollow lower end is used to reduce as much slip dislocation which is generated when the seed crystal is brought into contact with a silicon melt as possible, so that dislocation can be eliminated even when the neck portion is relatively thick, and thereby the strength of the neck portion can be improved.

According to the method, strength of the neck portion can be improved to some extent, since the neck portion can be formed to be thick. However, even in the method, a necking operation is performed and a neck portion in which slip dislocation is present is formed. Furthermore, the neck portion has to be thicker for manufacture of an ingot which is larger in a diameter and longer such as those manufactured in recent years, for example, the single crystal ingot having a weight of 150 kg or more, otherwise the strength may be insufficient. Accordingly, these inventions cannot solve the problems fundamentally.

Another problem in the necking method using the seed crystal having the special shape of the tip end mentioned above relates to a rate of success in making a crystal dislocation free. When the elimination of dislocation results in failure in the above-mentioned method, the seed crystal has to be exchanged to perform the method again. Accordingly, improvement in the rate of success in making a crystal dislocation free is especially important in the method. Elimination of dislocation cannot be achieved with a thick neck. According to a conventional necking method, when a diameter of a neck is more than 6–7 mm, elimination of dislocation is hardly achieved.

As used herein, the term "the rate of success in making a crystal dislocation free" relates to percentage of the number of the single crystal ingot having no slip dislocation to the total number of the pulled single crystal ingots.

The inventors studied the cause of lowering of the rate of success in making a crystal dislocation free, and found that control of the factors which have been controlled in the conventional methods, such as a shape of a seed crystal, a temperature holding time during which a seed crystal is held above a melt surface, a melting speed, or the like is not sufficient for improvement in the rate of success in making a crystal dislocation free and reproducibility.

SUMMARY OF THE INVENTION

The present invention has been accomplished to solve the above-mentioned previous problems. An object of the present invention is to provide a method of producing a silicon single crystal wherein increase of dislocation is suppressed and the rate of success in making a crystal dislocation free is improved in a seeding method wherein a necking operation is performed, and thereby productivity and yield of a heavy silicon single crystal having a large diameter can be improved.

To achieve the above mentioned object, the present invention provides a method for producing a silicon single crystal by Czochralski method which comprises bringing a seed crystal into contact with a melt, performing a necking operation and growing a single crystal ingot wherein concentration of interstitial oxygen incorporated during the necking operation is 1 ppma (JEIDA) or more.

When the concentration of oxygen incorporated during the necking operation is high, migration speed of the dislocation in the tapered necking part and the neck portion of the seed crystal is lowered due to presence of oxygen atoms, so that increase of the dislocation can be surely suppressed. As a result, the rate of success in making a crystal dislocation free, productivity and yield can be significantly improved.

It is preferable to put a quartz in the silicon melt during the necking operation in order to increase interstitial oxygen concentration during the necking operation.

When a stick or a plate made of quartz is put in almost the center portion of the melt during the necking operation, oxygen concentration around the neck portion and the tapered necking part of the seed crystal is increased, as quartz can be a source of oxygen, and thus oxygen can be easily incorporated in the neck portion and the tapered necking part.

In order to increase concentration of interstitial oxygen during the necking operation, the crucible is preferably rotated at high speed during the necking operation.

When the crucible is rotated at high speed, amount of oxygen dissolved into the silicon melt from the inner wall of the quartz crucible is increased, and thus oxygen concentration in the melt is increased. As a result, oxygen concentration around the tapered necking part and the neck portion is increased, so that oxygen can be easily incorporated in the tapered necking part and the neck portion.

In Czochralski method in which magnetic field is applied, it is preferable not to apply magnetic field to the silicon melt during the necking operation in order to increase the interstitial oxygen concentration during the necking operation.

In that case, when magnetic field is applied, convection of the silicon melt which has been forced to be suppressed can be liberated, so that oxygen concentration around the tapered necking part or the neck portion of the seed crystal is increased by the convection. As a result, oxygen can be easily incorporated into the tapered necking part or the neck portion, and the migration speed of the dislocation is lowered by the incorporated oxygen, so that increase of the dislocation is significantly suppressed, so that the rate of success in making a crystal dislocation free, reproducibility and yield can be significantly improved.

In another embodiment of the present invention, the diameter of the neck portion during the above-mentioned necking operation is 5 mm or more.

According to the present invention, increase of dislocation can be surely suppressed by increasing oxygen concentration during the necking operation, so that the single crystal having no dislocation can be easily produced. Accordingly, it is effective especially for formation of thick neck portion having a diameter of 5 mm or more. Therefore, the present method can achieve significantly high reproducibility of elimination of dislocation, and can cope with the tendency of the single crystal ingot to be of a larger diameter and heavier, so that productivity and yield of the silicon single crystal can be improved.

As described above, according to the present invention, the rate of success in making a crystal dislocation free of approximately 95% or more can be achieved, good reproducibility and long stability can also be enabled, in the seeding method wherein thick necking is performed, when a silicon single crystal ingot is pulled by Czochralski method. Accordingly, the method of the present invention can cope with the future tendency of the single crystal ingot to be of a larger diameter, and longer and heavier, and can achieve improvement in productivity, yield and cost reduction.

(a) is a figure showing the condition that the tip end of the seed crystal and the quartz disk come in contact with surface of the melt.

(b) is a figure showing the condition that the necking operation is completed, and the quartz disk is removed from the surface of the melt.

(c) is a figure showing the condition that growth of the silicon single crystal is initiated.

DESCRIPTION OF THE INVENTION AND EMBODIMENT

The present invention and embodiments of the present invention will be described below with referring drawings.

Figure 1:
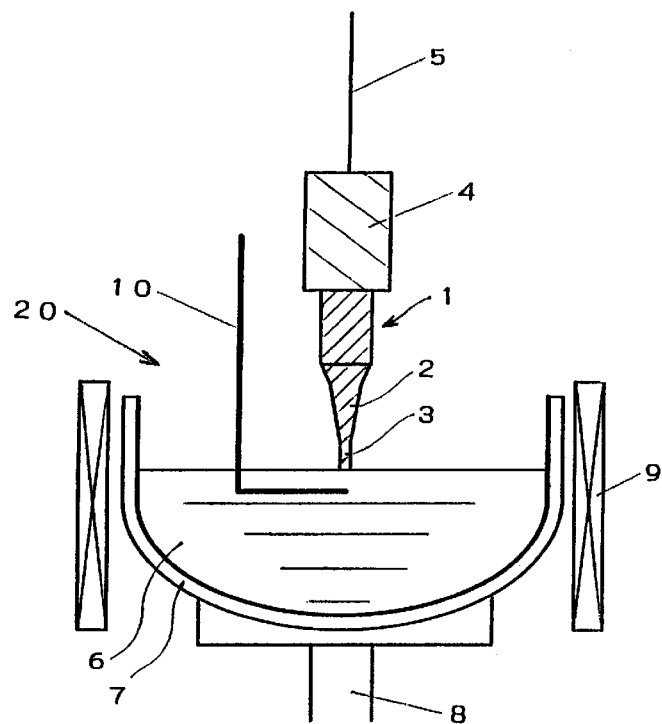
FIG. 1 is an explanatory view showing an apparatus for pulling a single crystal with which a necking operation is performed according to the present invention.

An example of constitution of an apparatus for pulling a single crystal used in the present invention is shown in FIG. 1. As shown in FIG. 1, the apparatus 20 for pulling crystal includes a crucible 7, a heater 9 disposed around the crucible 7, a crucible-rotating shaft 8 for rotating the crucible 7 and a rotation mechanism (not shown) therefor, a seed chuck 4 for holding a silicon seed crystal 1, a wire 5 for pulling the seed chuck 4, and a winding mechanism (not shown) for rotating and winding up the wire 5. The crucible 7 includes an inner quartz crucible for containing a silicon melt 6 and an outer graphite crucible located outside the quartz crucible.

Next will be described a method for a necking operation and a method for growing a single crystal of the present invention through use of the crystal pulling apparatus 20 mentioned above.

First, a high-purity polycrystalline material of silicon is heated to its melting point (approximately 1420° C.) or higher and is thus melted in the crucible 7. Next, a quartz stick 10 is dipped in the silicon melt 6, near the position where the single crystal is to be pulled. Then, the wire 5 is released until a tip end of the seed crystal comes into contact with the surface of the melt 6 at an approximately central portion or is immersed therein.

Subsequently, the crucible rotating shaft 8 is rotated in an appropriate direction, and the wire 5 is wound up with being rotated at the same time to pull the seed crystal 1, and thereby necking operation is initiated. Then, the tapered necking part 2 is grown until the diameter thereof becomes a predetermined value, and the neck portion 3 is grown until the length thereof becomes a predetermined value with keeping the diameter. Subsequently, a cone part is formed, followed by initiation of growing of the single crystal having a desired diameter. The single crystal ingot approximately in the shape of column (not shown) can be grown with controlling a pulling rate and temperature appropriately. The quartz stick 10 is preferably removed from the silicon melt 6 when the necking operation is completed.

Another method for dipping a quartz in the silicon melt during the necking operation relates to a method wherein a quartz in the shape of a disk is floated on the surface of the silicon melt.

Figure 2:
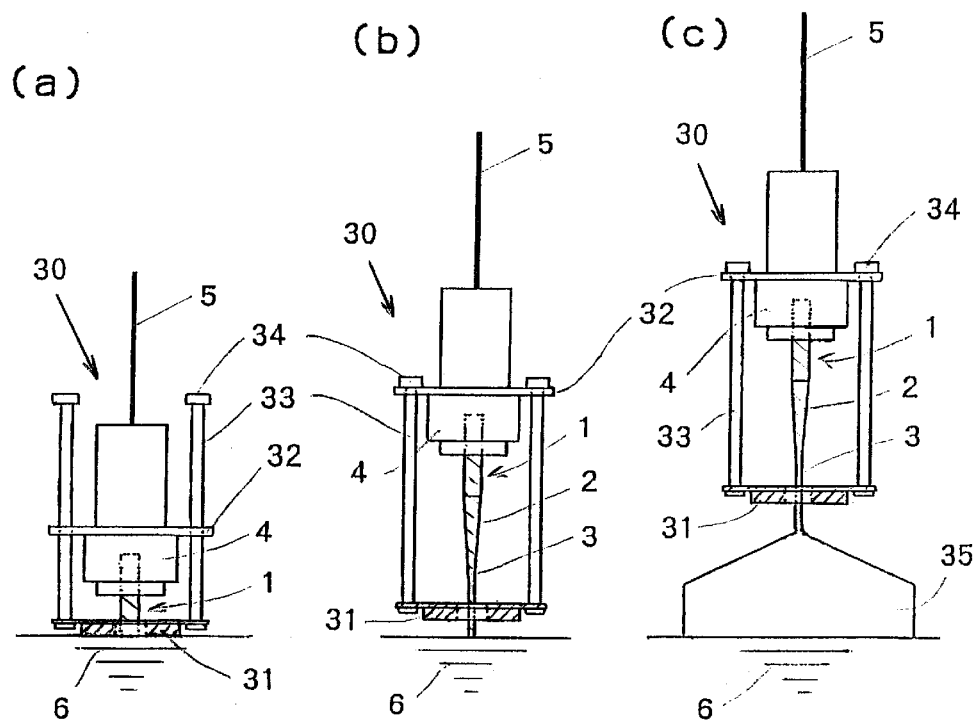
FIG. 2 is an explanatory view showing an apparatus for pulling a single crystal with which a necking operation is performed in another way according to the present invention.

In the method, a seed holder 30 shown in FIG. 2 is used. The seed holder 30 consists of a seed chuck 4 equipped with a slide plate 32 in the shape of a flange for holding a silicon seed crystal 1 and a circular quartz disk 31. Support rods 33 are vertically provided on the periphery of the disk 31. The seed chuck 4 can move vertically along the support rods 33 with the slide disk 32. Upper limit thereof is defined by a stopper 34 on the upper end of the support rod 33. It is connected to the wire 5 for pulling the seed chuck 4 and the quartz disk 31, and to the winding mechanism (not shown in the figure) for rotating and winding up the wire 5.

The necking operation and the method for growing single crystal according to the present invention through use of the seed holder 30 will be described in order of (a), (b), (c) of FIG. 2.

First, a high-purity polycrystalline material of silicon is heated to its melting point (approximately 1420° C.) or higher and is thus melted in the crucible (not shown in the figure). Next, the wire 5 is released, and thereby the seed holder 30 is brought down with holding the slide plate 32 of the seed chuck 4 at the upper stopper 34, so that the quartz disk 31 floats on the surface of the melt 6. Then, the wire 5 is further released, and thereby the seed chuck 4 is brought down with sliding the slide plate 32, until a tip end of the seed crystal 1 comes into contact with the surface of the melt 6 at an approximately central portion or is immersed therein (See FIG. 2(a)). Subsequently, the crucible is rotated in an appropriate direction, and the wire 5 is rotated and wound up with being rotated at the same time to pull the seed crystal 1, and thereby necking operation is initiated. Then, the tapered necking part 2 is grown until the diameter thereof is a predetermined diameter, and the neck portion 3 is grown until the length thereof becomes a predetermined value with keeping the diameter (See FIG. 2(b)), while the quartz disk 31 is always in contact with the silicon melt 6. Then, the slide plate 32 of the seed chuck 4 is stopped by the upper stopper 34, so that the quartz disk 31 is pulled up together with the seed chuck 4, and automatically separated from the melt 6. Thereby the role of the quartz disk 31 as oxygen source is over. Subsequently, a corn part is formed, followed by initiation of the growth of the silicon single crystal 35 having a predetermined diameter (See FIG. 2(c)). Then, the single crystal ingot approximately in the shape of column can be grown with controlling the pulling rate and temperature appropriately.

As described above, the inventors of the present invention have studied a cause of failing in achieving sufficient rate of success in making a crystal dislocation free in a necking operation is performed for growing a silicon single crystal ingot, especially when a thick neck portion having a diameter of 5 mm or more is formed, and have found that the cause of generation of the slip dislocation is closely related to oxygen concentration during the necking operation and further studied these conditions to complete the present invention.

Oxygen concentration during the necking operation has not been conventionally considered nor studied. In the conventional necking operation, concentration of oxygen incorporated during the necking operation is quite low as less than 1 ppma. Even when the necking operation is conducted under the same condition as that for growth of the straight body of the single crystal ingot, amount of oxygen incorporated in the neck portion is very little. This may be because the crystal grows at the position which is liable to be greatly affected by evaporation of oxygen from the surface of the silicon melt, since volume of the neck to be grown is small.

As for the migration speed of dislocation in the silicon crystal, kinetic characteristic of dislocation is significantly affected by oxygen atoms in high temperature under low stress. It is known that movement of dislocation is not observed in CZ crystal under low stress (fixing of dislocation due to oxygen) (K. Sumino, Japan, J. Appl. Phys., 19, p.L49. (1980)).

The inventors considered that increase of dislocation can be suppressed by incorporating certain amount of oxygen in the neck portion to lower the migration speed of dislocation, and tried to perform the necking operation under the condition that oxygen concentration is increased during the necking operation. As a result, they found that the rate of success in making a crystal dislocation free can be improved thereby.

Namely, they have studied and made experiments repeatedly as for oxygen concentration in the tapered necking part and the neck portion during the necking operation in the seeding method wherein the necking operation is performed, and have found that oxygen concentration of 1 ppma (JEIDA) or more can suppress increase of dislocation, and can achieve the rate of success in making a crystal dislocation free of 95% or more. Oxygen concentration less than 1 ppma is too low to achieve the effect of suppressing increase of dislocation.

Suppressing of increase of dislocation during the necking operation due to oxygen atoms is especially effective in the neck portion having a diameter of 5 mm or more. Accordingly, so-called thick-necking operation can be performed. The method for growing single crystal coping with the tendency of the single crystal ingot to be of a larger diameter and heavier enables high rate of success in making a crystal dislocation free, improvement in productivity and yield, and significant cost reduction.

Higher oxygen concentration is better. When oxygen concentration is 4 ppma or more, preferably 5 ppma or more, dislocation can be surely eliminated, even in the case that a thick neck portion as 5 mm or more in a diameter is formed. This tendency is significant in the case that the neck portion is formed without applying a magnetic field.

A method for increasing concentration of interstitial oxygen in the tapered necking part and the neck portion during the necking operation is, for example, as follows.

(1) Substance as oxygen source such as a stick, a plate, a brick or the like formed of quartz ($SiO_2$) is put in the silicon melt at almost the central position of the crucible during the necking operation.

FIG. 1 shows the condition wherein a quartz stick in the ell shape is put in the melt near the position where the necking operation is performed while the neck portion is pulled.

FIG. 2 shows that condition that a quartz disk is floated at almost the central position of the silicon melt during the necking operation. In this case, a cylinder made of quartz can be immersed in the melt.

In order to suppress influence of surface tension of the silicon melt, the lower surface of the quartz disk preferably inclines from one end to the other end of the disk, or from periphery to the center of the disk. When the inclination is made, it is possible to decrease the influence of surface tension which is caused when the quartz disk is separated from the silicon melt. Accordingly, it is possible to suppress the effect of swell of the melt and decrease an amount of the melt adhered on the quartz disk.

As described above, for example, when the quartz stick is put in almost the central portion of the silicon melt during the necking operation, oxygen concentration in the area is increased, so that oxygen can be easily incorporated in the tapered necking part or the neck portion.

In the method wherein the quartz disk is floated, when the quartz disk is rotated in the melt, dissolving amount of quartz increases, so that more oxygen can be supplied. Furthermore, since the surface of the melt is covered with the quartz disk, evaporation of oxygen is suppressed, so that oxygen concentration in the melt can be increased more effectively. Moreover, amount of oxygen supplied from the quartz disk can be controlled by selecting the number of rotation of the seed crystal or area of the quartz disk appropriately.

Alternatively, (2) forced convection is applied to the silicon melt by increasing the number of rotation of the crucible during the necking operation, so that oxygen from the quartz which is material of the crucible is sent to the surface in almost the central portion of the crucible.

As described above, when the number of rotation of the crucible is increased, amount of oxygen dissolved in the silicon melt from the quartz inner wall is increased, so that oxygen concentration in the melt is increased. As a result, oxygen concentration around the tapered necking part and the neck portion of the seed crystal is increased, so that oxygen can be easily incorporated in the tapered necking part and the neck portion. Specifically, the number of the rotation of the crucible during the necking operation is controlled to be higher than the number of rotation of the crucible during growing the straight body of the single crystal ingot. For example, when the crucible having a diameter of 18 inches is used, the number of rotation is 15 rpm or more. However, it is not intended to limit the present invention.

(3) In the method wherein a magnetic field is applied, a magnetic field is not applied to the silicon melt during the necking operation.

Accordingly, convection of the silicon melt suppressed by force by applying the magnetic field is liberated, so that oxygen concentration around the tapered necking part and the neck portion is increased due to convection, and oxygen can be easily incorporated in the tapered necking part and the neck portion. Moreover, the rate of movement of dislocation is reduced due to the incorporated oxygen so that increase of dislocation is extremely suppressed, the rate of success in making a crystal dislocation free can be improved, and productivity and yield can also be significantly improved.

(4) Other method for increasing oxygen concentration during the necking operation is: a method of changing of temperature distribution in the silicon melt, a method of increasing gas atmosphere pressure so that oxygen may not be evaporated easily, or the like.

EXAMPLE

The following examples and comparative examples are being submitted to further explain the present invention. These examples are not intended to limit the scope of the present invention.

Example

A quartz stick was inserted in the melt during the necking operation in order to increase oxygen concentration in the necking operation, while a thick neck portion was formed. Then, single crystal was grown according to MCZ method.

50 kg of polycrystalline silicon was charged in a quartz crucible having a diameter of 450 mm, and melted by heating. A columnar seed crystal having a diameter of 14 mm was then brought down to be in contact with the melt. Subsequently, horizontal magnetic field was applied to the melt so that magnetic field strength in the center of the crucible may be 3000 Gauss, and then the neck portion having a diameter of 6 mm was pulled by necking operation with slightly rotating the crucible. Thereby, a single crystal having a diameter of 150 mm was grown. A quartz stick in the ell shape having a diameter of 20 mm was inserted in the melt shortly before initiation of the necking operation to increase oxygen concentration near the tapered necking part and the neck portion. After the necking operation, the quartz stick was pulled from the melt. The rate of success in making a crystal dislocation free was appreciated to be 95%. Oxygen concentration of the neck portion was 1.5 ppma (JEIDA) as measured with Fourier-transformation type infrared spectroscope.

Comparative Example

The single crystal was pulled and examined in the same method as Example 1 except that the quartz stick was not used during the necking operation. The rate of success in making a crystal dislocation free was 25%. Oxygen concentration in the neck portion was 0.5 ppma(JEIDA).

The present invention is not limited to the above-described embodiment. The above-described embodiment is a mere example, and those having the substantially same structure as that described in the appended claims and providing the similar action and effects are included in the scope of the present invention.

For example, in the above-described embodiment, the silicon single crystal having a diameter of 150 mm (6 inches) was grown. However, the present invention can be applied to a method of pulling a crystal recently produced having larger diameter, for example, 200 mm (8 inches) to 400 mm (16 inches), or more.

Moreover, the method of the present invention can be applied not only for a Czochralski method but also for any type of MCZ method (Magnetic field applied Czochralski crystal growth method) in which magnetic field is applied when the silicon single crystal is pulled. Namely, the term "a Czochralski method" includes not only general Czochralski method but also MCZ method.

What is claimed is:

1. A method for producing a silicon single crystal by Czochralski method which comprises bringing a seed crystal into contact with a melt, performing a necking operation and growing a single crystal ingot wherein concentration of interstitial oxygen incorporated during the necking operation is 1 ppma (JEIDA) or more.

2. The method according to claim 1 wherein a quartz is put in the silicon melt during the necking operation in order to increase concentration of interstitial oxygen during the necking operation.

3. The method according to claim 2 wherein the crucible is rotated at high speed during the necking operation in order to increase concentration of interstitial oxygen during the necking operation.

4. The method according to claim 3 wherein magnetic field is not applied to the silicon melt during the necking operation in order to increase the concentration of interstitial oxygen during the necking operation in Czochralski method in which magnetic field is applied.

5. The method according to claim 4 wherein a diameter of said neck portion is 5 mm or more.

6. The method according to claim 3 wherein a diameter of said neck portion is 5 mm or more.

7. The method according to claim 2 wherein magnetic field is not applied to the silicon melt during the necking operation in order to increase the concentration of interstitial oxygen during the necking operation in Czochralski method in which magnetic field is applied.

8. The method according to claim 7 wherein a diameter of said neck portion is 5 mm or more.

9. The method according to claim 2 wherein a diameter of said neck portion is 5 mm or more.

10. The method according to claim 1 wherein the crucible is rotated at high speed during the necking operation in order to increase concentration of interstitial oxygen during the necking operation.

11. The method according to claim 10 wherein magnetic field is not applied to the silicon melt during the necking operation in order to increase the concentration of interstitial oxygen during the necking operation in Czochralski method in which magnetic field is applied.

12. The method according to claim 11 wherein a diameter of said neck portion is 5 mm or more.

13. The method according to claim 10 wherein a diameter of said neck portion is 5 mm or more.

14. The method according to claim 1 wherein magnetic field is not applied to the silicon melt during the necking operation in order to increase the concentration of interstitial oxygen during the necking operation in Czochralski method in which magnetic field is applied.

15. The method according to claim 14 wherein a diameter of said neck portion is 5 mm or more.

16. The method according to claim 1 wherein a diameter of said neck portion is 5 mm or more.

* * * * *